United States Patent [19]

Pepper

[11] Patent Number: 5,057,771
[45] Date of Patent: Oct. 15, 1991

[54] PHASE-LOCKED TIMEBASE FOR ELECTRO-OPTIC SAMPLING

[75] Inventor: Steven H. Pepper, Portland, Oreg.

[73] Assignee: Tetronix, Inc., Beaverton, Oreg.

[21] Appl. No.: 539,260

[22] Filed: Jun. 18, 1990

[51] Int. Cl.⁵ .......................................... G01R 31/28
[52] U.S. Cl. .................... 324/158 R; 324/96
[58] Field of Search ................ 324/158 R, 96, 77 A, 324/77 K, 121 R, ; 73/861.17

[56] References Cited

U.S. PATENT DOCUMENTS

| | | | |
|---|---|---|---|
| 2,808,723 | 10/1957 | Buntenbach | 73/861.17 |
| 3,316,762 | 5/1967 | Westersten | 73/861.17 |
| 3,638,024 | 1/1972 | Chen et al. | 350/147 |
| 3,925,727 | 12/1975 | Duguay | 324/121 R |
| 4,434,399 | 2/1984 | Mourou et al. | 324/96 |
| 4,456,877 | 6/1984 | Brown | 324/77 K |
| 4,698,497 | 10/1987 | Miller et al. | 324/96 |
| 4,716,363 | 12/1987 | Dukes et al. | 324/77 R |
| 4,896,109 | 1/1990 | Rauscher | 324/77 A |

OTHER PUBLICATIONS

Eisenstadt et al.; IEEE Trans on Electron Devices; vol. ED-32; No. 2; Feb. 1985; pp. 364–369.
"Phase-Locked Sampling Instruments", Chu-Sun Yen, IEEE Trans. on Instrumentation & Measurement, Mar.-Jun. 1965 pp. 64–68.
"Subpicosecond Electrooptic Sampling: Principles and Applications", J. Valdmanis & G. Mourou, IEEE Journal of Quantum Electronics, vol. QE-22, No. 1, Jan. 1986.
"Electrooptic Sampling in GaAs Integrated Circuits", Brian H. Kolner and David M. Bloom, IEEE Journal of Quantum Electronics, vol. QE-22, No. 1, Jan. 1986.

*Primary Examiner*—Ernest F. Karlsen
*Attorney, Agent, or Firm*—John D. Winkelman; John Smith-Hill

[57] ABSTRACT

A phase-locked timebase for electrical and electro-optic sampling has an offset phase-locked loop for controlling the delay between a stimulus reference signal and a sample strobe signal. A reference signal source synchronizes a stimulus source for a device under test and also is input to the phase detector of a phase-locked loop. Also input to the phase-locked loop in the baseband section is a sample phase control signal. The output of the offset phase-locked loop is an integer multiple of the reference signal source that is delayed from the reference signal source by a controlled amount. The output of the offset phase-locked loop is input to a low noise synchronous detection circuit that mixes a response signal from the device with an impulse sample strobe generated from the output of the phase-locked loop. The mixed response signal is detected, integrated and output at a rate equal to or much lower than the sample rate, as determined by the integration time.

14 Claims, 2 Drawing Sheets

PHASE-LOCKED TIMEBASE FOR ELECTRO-OPTIC SAMPLING

BACKGROUND OF THE INVENTION

The present invention relates to timebase generators, and more particularly to a phase-locked timebase for electro-optic sampling that synchronizes the sampling of the response of a device under test with a stimulus, and controls the delay between them.

In many test and measurement devices only the response of a device under test is available. In order to measure the response where it is a repetitive signal, a trigger signal, either external or internal, is generated to sample the response signal. The generation of the trigger signal has a certain minimum delay and a certain amount of delay jitter which causes sampling for a given point of the response signal to be offset from sample to sample, resulting in smearing of the value of the point and in the inability to sample the response before or near the trigger event. Averaging of the samples may be used to reduce the noise associated with this jitter. However, where the response is an impulse that is shorter in duration than the jitter of the trigger signal, the resulting averaged sample value is erroneous. Therefore it is advantageous to control both the stimulus as well as the sampling of the response for a device under test so that the requirement for generating the trigger signal may be eliminated.

Various stimulus/response systems have been developed to test a device under test. For example U.S. Pat. No. 4,434,399 issued to Mourou et al discloses an electrooptic sampling system that generates an optical pulse which is split (a) to energize a stimulus circuit for a device under test and (b) to generate a sampling strobe pulse to sample the response of the device. The strobe pulse has a variable optical path controlled by an optical delay line that is mechanically adjustable, the difference in path lengths determining the sampling time vis a vis the stimulus time.

Another technique is a delta frequency technique described by Brian Kolner and David Bloom ("Electrooptic Sampling in GaAs Integrated Circuits" IEEE J. Quantum Electron., Vol. QE-22, pps. 79-93, 1986). A pair of frequency synthesizers generate a first frequency for synchronizing an optical pulse source, and a second frequency that is an integer multiple of the first frequency plus a small offset, such as one Hertz. The first frequency is used to sample a device under test while the device is stimulated by an electrical signal at the second frequency. The reflected optical energy from the device is detected and the polarization of the return is a measure of the voltage of the device response at the sample time. However, the synthesizers are complex and expensive, especially due to the fractional N synthesizing techniques that provide the small offset for the sampling frequency.

What is desired is an inexpensive means for automatically and precisely controlling the stimulus/response signals for a device under test without the need for expensive frequency synthesizers, mechanical delay stages or trigger generation circuits.

SUMMARY OF THE INVENTION

Accordingly the present invention provides a phase-locked timebase for electro-optic sampling that has an offset phase-locked loop for controlling the delay between a stimulus reference signal and a sample strobe signal. A reference signal source synchronizes a stimulus source for a device under test and also is input to the phase detector of a phase-locked loop. Also input to the phase-locked loop in the baseband section is a sample phase control signal. The output of the phase-locked loop is an integer multiple of the reference signal source that is offset in phase from the reference signal source by a controlled amount. The output of the phase-locked loop is a sample clock which is input to both a low noise synchronous detection circuit and a strobe generating circuit that mixes a response signal from the device with an impulse sample strobe derived from the output. The mixed response signal is synchronously detected, averaged over n samples and output at a rate 1/n times the sample rate.

The objects, advantages and novel features of the present invention are apparent from the following detailed description when read in conjunction with the appended claims and attached drawing.

DESCRIPTION OF THE PREFERRED EMBODIMENT

Figure 1:
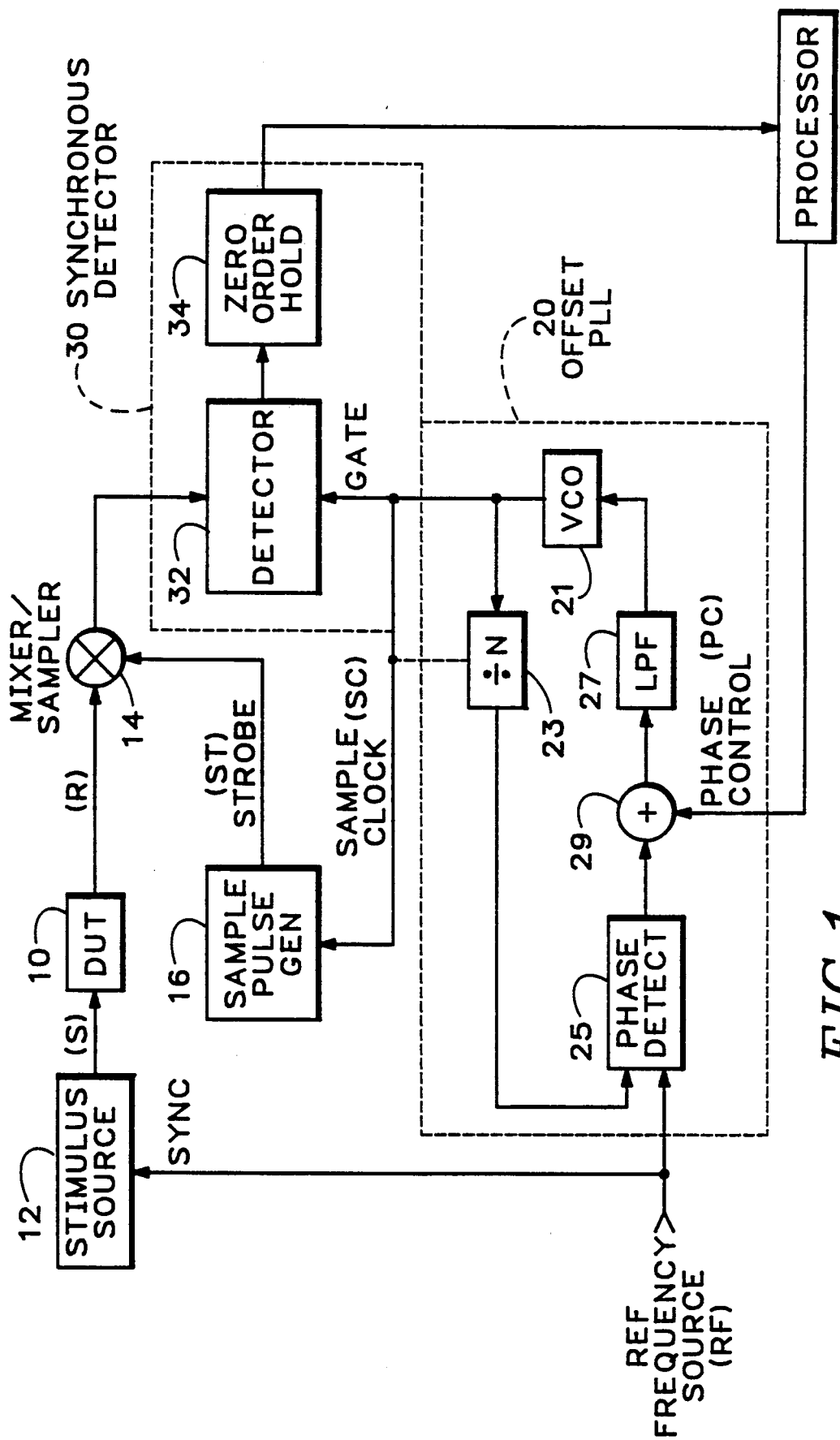
FIG. 1 is a block diagram of a phase-locked timebase for electro-optic sampling according to the present invention.

Referring now to FIG. 1 a device under test (DUT) 10 is shown that is stimulated by a stimulus source 12 or sources that are synchronized by a reference frequency signal. The response of the DUT 10 to the stimulus is input to a sampling mixer 14. The reference frequency signal also is input to an offset phase-locked loop 20 that generates a clock signal having a frequency that is an integer multiple of the frequency of the reference frequency signal, but is phase shifted with respect to the reference frequency signal. The clock signal from the offset phase-locked loop 20 is input to a sample pulse generator 16 to trigger a sample strobe pulse that also is input to the mixer 14, the sample strobe pulse being delayed with respect to the stimulus signal by an amount determined by the phase shift of the clock signal. The output of the mixer 14 is a sample of the response signal from the DUT 10. The response signal sample is input to a low noise synchronous detector 30 to provide an output signal at a possibly lower rate than the sample rate to a processor (not shown) where it is processed for display, as is well known in the art.

The offset phase-locked loop 20 has a voltage controlled oscillator (VCO) 21 with a nominal frequency of Nf, where N is an integer and f is the frequency of the reference frequency signal. The output of the VCO 21 is input to a divider 23 to convert the output to the frequency of the reference frequency signal, and the divided output together with the reference frequency signal is input to a phase detector 25. The output of the phase detector 25 is a baseband signal that may be used to control the frequency of the VCO 21 via a low pass filter 27 to lock the VCO output to the reference frequency, a conventional phase-locked loop. However in the d.c. path between the output of the phase detector 25 and the low pass filter 27 is inserted a summation circuit 29. An offset, or phase control, signal is input to the summation circuit 29 from the processor to compensate for the phase difference between the VCO output and the reference signal source, i.e., the control signal applied to the VCO 21 is essentially zero due to the negative feedback loop gain so the frequency stays at Nf, but the phase of the signal with respect to the reference frequency signal is offset by an amount determined by the phase control signal.

The output of the mixer 14 is input to a detector 32, preferably a phase sensitive detector as disclosed in co-pending U.S. Pat. Application Ser. No. 07/539,401 filed June 18, 1990 that compensates for variation in the amplitudes of the strobe signals. The output of the detector 32 is input to an accumulator or zero order hold circuit 34 that acts as an ideal gated integrator. After a given number of samples have been accumulated the output of the zero order hold circuit 34 is passed to the processor for display. The processor may use an adaptive process to determine the number of samples to be accumulated for each point and the delay between points on the response signal from the DUT 10 so that areas of little change are undersampled while areas of significant change, such as edges of a digital pulse signal, are oversampled to achieve a given signal-to-noise (S/N) ratio and equivalent time sample rate, as is well known in the art. Thus for every X samples of a given point on the response signal that is determined by the phase control signal, including X=1, a single value is returned to the processor.

For use as an electro-optic sampler the output of the DUT 10 is an electrical signal and the output of the sample pulse generator 16 is a very short optical pulse. The sample pulse generator 16 may be of the type described in co-pending U.S. Pat. Application Ser. No. 07/446,515 filed Dec. 5, 1989 by R. Thomas Hawkins II entitled "Ultra-Short Optical Pulse Source" now U.S. Pat. No. 5,014,015. The output of the mixer 14 is an optical signal that is detected by a photodetector as part of the detector 32 and converted to an electrical signal. The output of the detector 32 is gated by the clock signal from the VCO 21 only during the period when the response signal from the DUT 10 is being sampled in the mixer 14. Therefore the output of the detector 32 is zero except during the sampling pulse, and the zero order hold circuit 34 accumulates only the sampled response signal.

The reference frequency signal may have a frequency of ten megahertz, while the sample clock signal may be on the order of tens of gigahertz. The sample strobe pulse is on the order of a few picoseconds. The phase control signal may be a stepped ramp signal where the amplitude range is adjusted to just encompass a portion of the response signal that is of interest and the number of steps represents the number of output sample points of the response signal. The duration of each step of the stepped ramp signal determines the number of samples accumulated for each output sample point of the response signal. Although a ramped phase control signal provides the output samples in sequence across the response signal, other phase control signals may be used that sample the response signal non-sequentially. Since the delay between the stimulus pulse from the reference frequency signal and the sample strobe pulse is precisely determined, the processor may insert each sample into an appropriate bin in the processor memory to reproduce the response signal on a display.

Figure 2A:
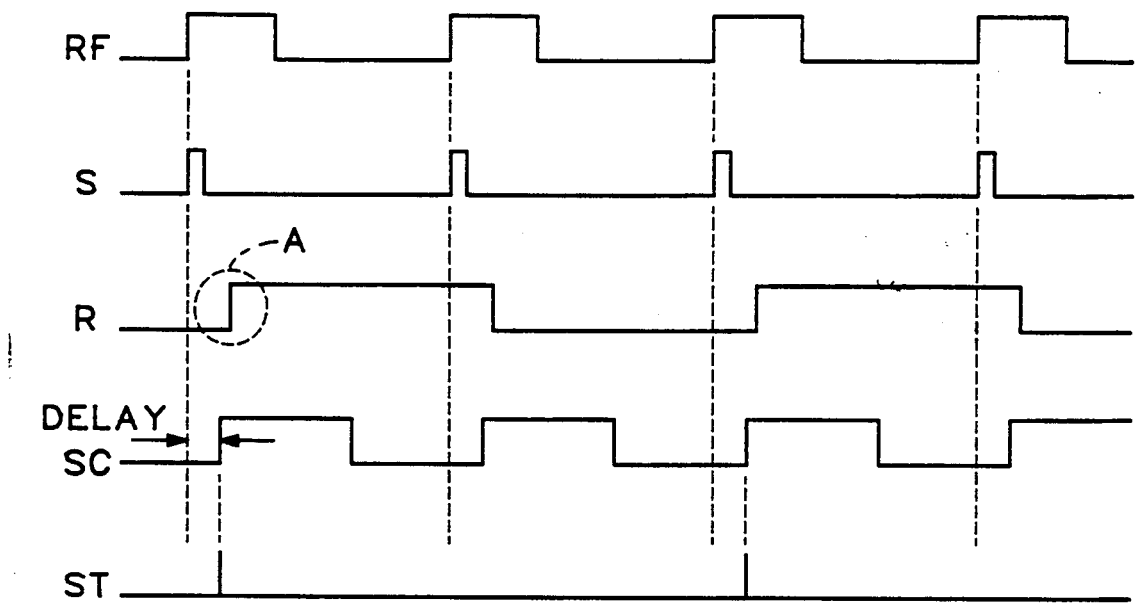
FIG. 2 *a* is a representative waveform diagram illustrating the operation of the present invention.
FIG. 2*b* represents in greater detail a portion of the waveforms of FIG. 2*a*.
FIG. 2*c* is a representative phase control waveform for the present invention.
Figure 2B:
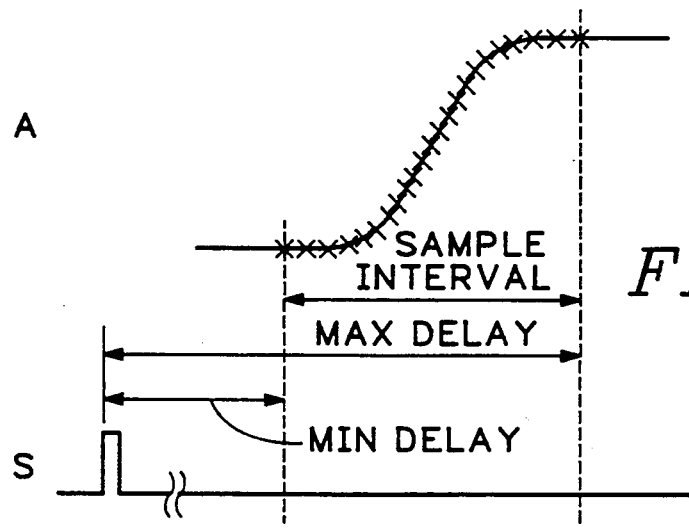
Figure 2C:
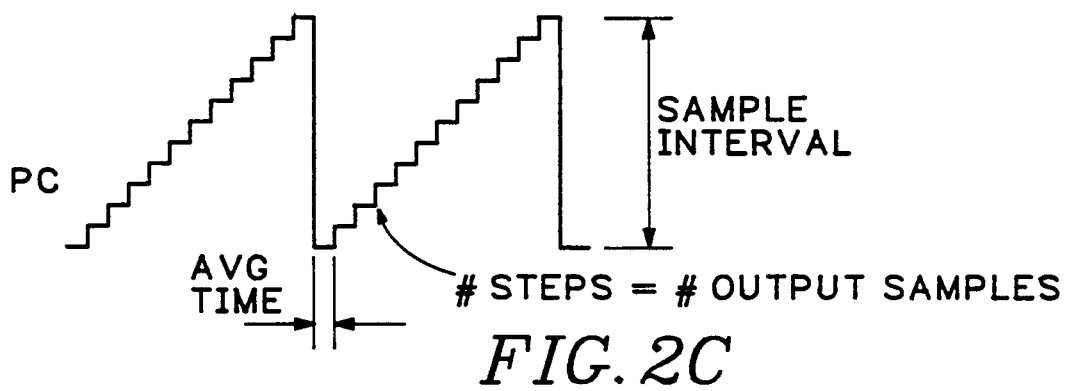

As shown in FIGS. 2a-c a reference frequency signal (RF) may be a square wave signal, and the stimulus signal (S) may be a pulse signal. If the device under test 10 is a bi-stable flip-flop, each pulse causes the flip-flop to change state, resulting in the response signal (R). The sample clock (SC) is delayed, or phase shifted, with respect to the reference frequency signal. In this illustration the sample clock has the same frequency as the reference frequency signal, i.e., N=1. The sample clock triggers the sample pulse generator 16 to produce the strobe pulse signal (ST). The areas of interest in analyzing the flip-flop are the leading and trailing edges. So the phase control signal (PC) controls the delay between the reference frequency signal and the sample clock so that samples of the response signal are taken only around the desired edges as shown in section A. For an adaptive process fewer samples per sample point are taken at the end states of the response signal, while many sample points are taken along the edge to provide a precise reproduction of the edge for display. For a stepped ramp phase control signal as shown the sample range is determined by the minimum and maximum voltage levels that determine the minimum and maximum delay times between the stimulus pulse and the strobe pulse, and this range may be determined by an operator to encompass only the areas of interest on the waveform rather than having to accept data from an entire iteration of the waveform as in the frequency synthesizer embodiment of the prior art. The duration of each step determines the number of samples per sample point, and the number of steps determines the number of sample points during the sample range.

Thus the present invention provides a phase-locked timebase for electro-optic sampling that uses an offset phase-locked loop to generate a sample strobe pulse that has a precise delay with respect to the stimulus of a device under test so that multiple samples at the same point on a repetitive response signal from the device under test may be accumulated to increase the signal to noise ratio.

What is claimed is:

1. A time base for sampling a response signal from a device under test, comprising:
   stimulus means for receiving a periodic reference signal and generating a stimulus signal in response thereto, and for applying the stimulus signal to the device under
   a phase-locked loop for receiving the periodic reference signal and generating a sample clock in response thereto, the sample clock being offset in phase by a controllable amount with respect to the periodic reference signal, and
   sampling means for receiving a repetitive response signal provided by the device under test and sampling the repetitive response signal as a function of the sample clock, whereby the response signal is sampled at sample points that depend on said controllable amount.

2. A timebase according to claim 1, wherein the sampling means comprising:
   means for converting the sample clock into a strobe signal, and
   means for mixing the strobe signal with the repetitive response signal to produce a plurality of samples for each sample point.

3. A timebase according to claim 1, further comprising means for detecting the sampled repetitive response signal to produce an output sample for each sample point at a lower rate than the frequency of the sample clock.

4. A timebase according to claim 3, wherein the detecting means comprises means for receiving the samples for each sample point and converting the samples to a representation of an electrical signal.

5. A time base according to claim 1, wherein the phaselocked loop comprises a controllable oscillator for producing the sample clock at a frequency that depends on a control signal applied to the controllable oscillator, a phase detector for detecting phase difference between the sample clock and the reference signal to provide a phase difference signal, and offset means for adding an offset signal to the phase difference signal to provide the control signal.

6. A time base according to claim 5, comprising a processor for receiving the samples provided by the sampling means and generating the offset signal that is applied to the offset means.

7. A timebase according to claim 5, wherein the sampling means comprises:
    means for converting the sample clock into a strobe signal; and
    means for mixing the strobe signal with the repetitive response signal to produce a plurality of samples for each sample point.

8. A timebase according to claim 5, further comprising means for detecting the sampled repetitive response signal to produce an output sample for each sample point at a lower rate than the frequency of the sample clock.

9. A timebase according to claim 8, wherein the detecting means comprises means for receiving the samples for each sample point in converting the samples to a representation of an electrical signal.

10. A time base for sampling a response signal from a device under test, comprising:
    stimulus means for receiving a periodic reference signal and generating a stimulus signal in response thereto, and for applying the stimulus signal to the device under test,
    a controllable oscillator for producing a sample clock at a frequency that depends on a control signal applied to the controllable oscillator,
    a phase detector for detecting phase difference between the reference signal and a signal derived from the sample clock to provide a phase difference signal,
    offset means for adding a controllable offset signal to the phase difference signal to provide the control signal, whereby the sample clock is offset in phase by a controllable amount with respect to the periodic reference signal, and
    sampling means for receiving a repetitive response signal provided by the device under test and sampling the repetitive response signal as a function of the sample clock, whereby the response signal is sampled at sample points that depend on said controllable amount.

11. A timebase according to claim 10, wherein the sampling means comprises:
    means for converting the sample clock into a strobe signal, and
    means for mixing the strobe signal with the repetitive response signal to produce a plurality of samples for each sample point.

12. A timebase according to claim 10, further comprising means for detecting the sampled repetitive response signal to produce an output sample for each sample point at a lower rate than the frequency of the sample clock.

13. A timebase according to claim 12, wherein the detecting means comprises means for receiving the samples for each sample point and converting the samples to a representation of an electrical signal.

14. A time base according to claim 10, comprising a processor for receiving the samples provided by the sampling means and generating the offset signal that is applied to the offset means.

* * * * *